(12) United States Patent
Snider

(10) Patent No.: US 6,704,909 B1
(45) Date of Patent: Mar. 9, 2004

(54) REDUCTION OF STORAGE ELEMENTS IN SYNTHESIZED SYNCHRONOUS CIRCUITS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/176,424

(22) Filed: Jun. 19, 2002

(51) Int. Cl.⁷ .............................................. G06F 17/50
(52) U.S. Cl. .................. 716/1; 716/2; 716/18
(58) Field of Search .............. 716/1, 4–6, 10, 716/18; 717/140, 160; 703/14–16, 28

(56) References Cited

U.S. PATENT DOCUMENTS

| | | | |
|---|---|---|---|
| 6,377,912 B1 * | 4/2002 | Sample et al. ................. | 703/28 |
| 6,421,818 B1 * | 7/2002 | Dupenloup et al. ........... | 716/18 |
| 6,460,173 B1 * | 10/2002 | Schreiber ...................... | 716/18 |
| 6,507,947 B1 * | 1/2003 | Schreiber et al. ............ | 717/160 |
| 6,560,754 B1 * | 5/2003 | Hakewill et al. .............. | 716/4 |

OTHER PUBLICATIONS

Hoon Choi; In–Cheol Park; "Coware pipelining for exploitin intellectual properties and software codes in processor-based designs", 13th annual IEEE International, 13 Sep. 16, 2000. pages(s): 153–157.*

Park et al, "Sehwa: A Software Package for Synthesis of Pipelines from Behavioral Specifications," IEEE, Mar. 1988, vol. 7, N 3, pp. 356–370.*

Chen et al, "A General Methodology of Partitioning and Mapping for Given Regular Arrays," IEEE Transactions on Parallel and Distributed Systems, vol. 6, No. 10, pp. 1100–1107.*

Darte, A.; Risset, T.; Robert, Y.; "Synthesizing systolic arrays: some recent developments" Proceedings of the International Conference on, 2, Sep. 4, 1991; pages(s): 372–386.*

T. Callahan, J. Wawrzynek, "Adapting Software Pipelining for Reconfigurable Computing," Proceedings of the International Conference on Compilers, Architectures and Synthesis for Embedded Systems.

* cited by examiner

*Primary Examiner*—Vuthe Siek
*Assistant Examiner*—Naum Levin

(57) ABSTRACT

Method and apparatus for reducing a number of storage elements in a synthesized synchronous circuit. In one embodiment, the circuit is represented as a directed, partitioned graph. The graph is divided into a plurality of time-ordered time slots that are bounded by storage elements. The strongly-connected components (SCCs) in the graph are first identified. For each middle SCC where there is slack between the middle SCC and a first SCC and slack between the middle SCC and a second SCC, a time-slot-relative direction is selected for moving the middle SCC. The direction is selected as a function of a number of storage elements required for moving the middle SCC toward the first SCC versus moving the middle SCC toward the second SCC. The middle SCC is then moved in the selected time-slot-relative direction.

13 Claims, 4 Drawing Sheets

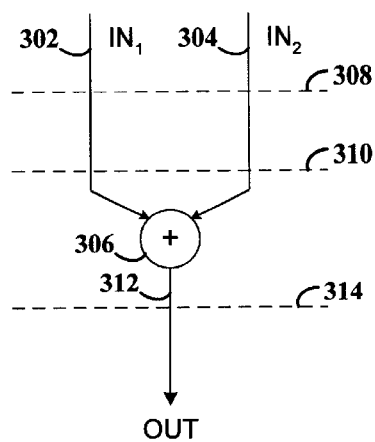
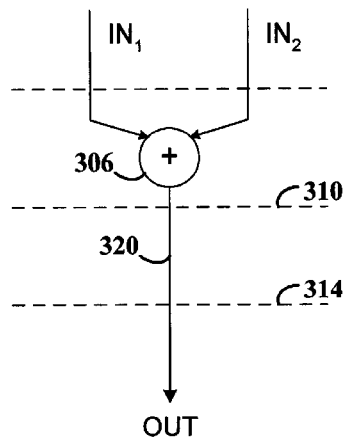
FIG. 3A    FIG. 3B
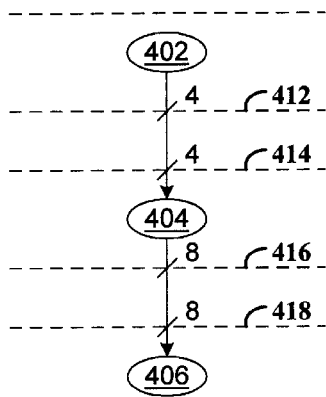
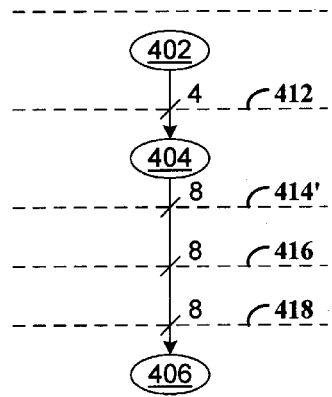
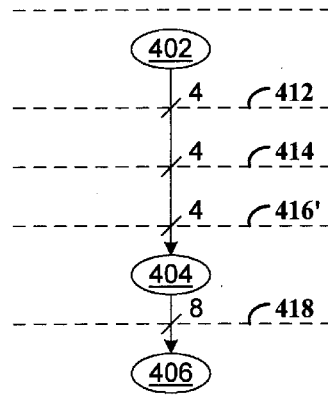
FIG. 4A    FIG. 4B    FIG. 4C

REDUCTION OF STORAGE ELEMENTS IN SYNTHESIZED SYNCHRONOUS CIRCUITS

FIELD OF THE INVENTION

The present invention generally relates to mapping software program loops to a hardware implementation.

BACKGROUND

Software-implemented designs, or parts thereof, are sometimes re-implemented in hardware for cost and performance reasons. Program loops within the software are synthesized in hardware as synchronous circuits that include interconnected logic units and registers that are synchronously clocked.

Live-in variables to the loop correspond to primary inputs of the circuit, live-out variables correspond to primary outputs, and recurrences correspond to registers or RAMs. This correspondence allows synchronous circuit optimization techniques, along with compiler techniques to be applied to the problem of mapping such loops onto efficient synchronous circuit implementations.

Generally, the result of loop synthesis is a multi-staged pipeline structure consisting of logic and registers. Data flows both forward from the outputs of registers in one stage to the inputs of logic (or registers) in later stages, and backward from the output of logic (or registers) in one stage to the inputs of logic (or registers) in previous stages.

Pipeline compaction is a known technique for reducing the number of registers in pipelined circuit structures. In a circuit design that is represented as a graph with nodes and edges, pipeline compaction iteratively minimizes the slack on all input edges on all strongly connected components (SCCs), moving each SCC backward to the earliest legal time slot. An SCC is a subset, S, of nodes in a graph such that any node in S is reachable from any other node in S, and S is not a subset of any larger such set.

Even though pipeline compaction is effective in reducing the register requirements of a pipelined circuit design, pipeline compaction does not always produce an optimally reduced circuit.

A system and method that address the aforementioned problems, as well as other related problems, are therefore desirable.

SUMMARY OF THE INVENTION

In various embodiments, the present invention provides a method and apparatus for reducing a number of storage elements in a synthesized synchronous circuit. In one embodiment, the circuit is represented as a directed, partitioned graph. The graph is divided into a plurality of time-ordered time slots that are bounded by storage elements. The strongly-connected components (SCCs) in the graph are first identified. For each middle SCC where there is slack between the middle SCC and a first SCC and slack between the middle SCC and a second SCC, a time-slot-relative direction is selected for moving the middle SCC. The direction is selected as a function of a number of storage elements required for moving the middle SCC toward the first SCC versus moving the middle SCC toward the second SCC. The middle SCC is then moved in the selected time-slot-relative direction.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3A is an graph of an example circuit in which two input signals lines have slack relative to an adder node;

FIG. 3B shows the adder node of FIG. 3A having been moved one timeslot earlier;

FIG. 4A is a partitioned directed graph of an example circuit;

FIG. 4B illustrates an SCC of FIG. 4A having been moved backward in the time schedule;

FIG. 4C illustrates an SCC of FIG. 4A having been moved forward in the schedule;

DETAILED DESCRIPTION

Figure 1:
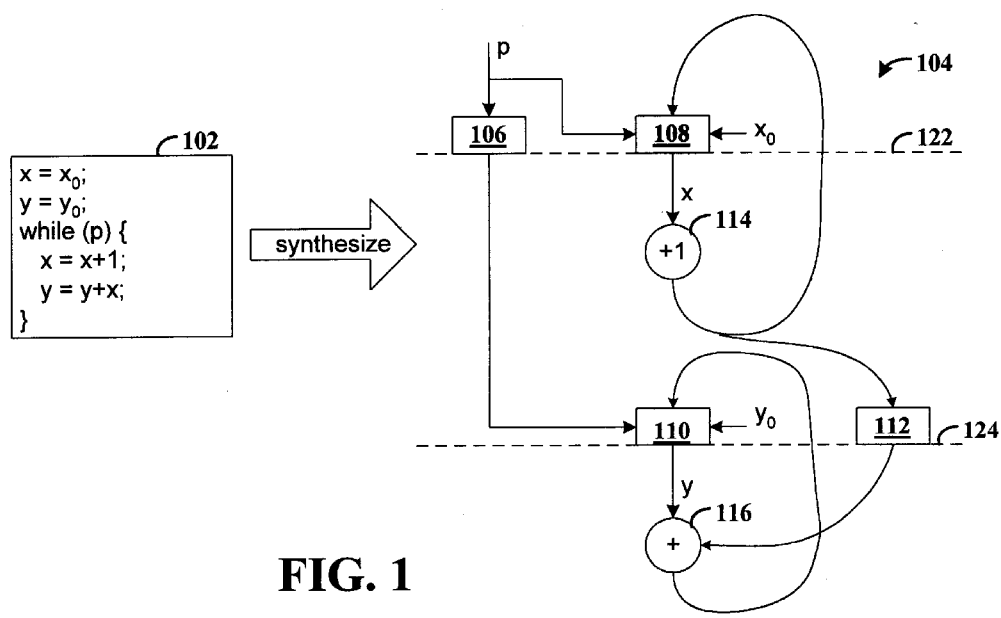
FIG. 1 illustrates an example program loop synthesized into a hardware implementation.

FIG. 1 illustrates an example program loop 102 synthesized into a hardware implementation 104. Blocks 106, 108, 110, and 112 represent registers, and circles 114 and 116 represent logic. The signals that enter the left sides of the registers are enable signals, and the signals that enter the right sides of the registers are initial values. Input data signals enter the tops of the registers and logic, and output data signals exit from the bottom of the registers and logic.

Dashed lines 122 and 124 represent time-relative stages of the hardware implementation. The hardware between line 122 and 124 is stage 122, and the hardware below line 124 is stage 124. It can be seen that some signals feed forward from stage 122 to stage 124, for example, the input data signal to register 122, and other signals feed backward from stage 124 to stage 122, for example, the output data signal from logic 116 feeds back as input data to register 110.

It is often the case that pipelining produces circuits with a large number of registers. Because registers occupy chip area, it is desirable to minimize the number of registers in the implementation in order to reduce the cost of implementing the circuit, preferably without reducing the performance of the circuit.

Before describing the example embodiments of the invention, FIGS. 2A, 2B, 3A, 3B, and 4A–C are presented as background to introduce terminology and concepts used in the present invention.

Figure 2A:
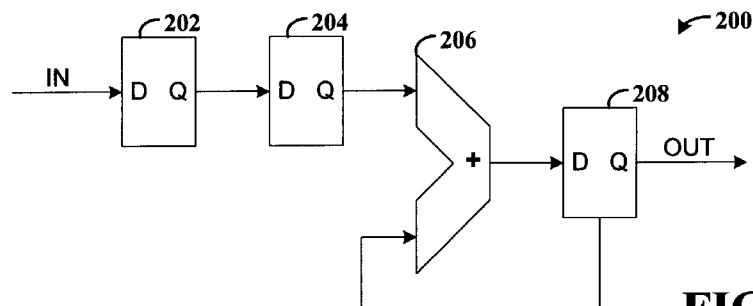
FIG. 2A illustrates an example circuit.
Figure 2B:
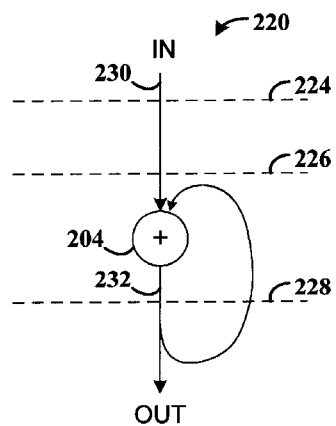
FIG. 2B illustrates a graphical representation of the circuit of FIG. 2A.

FIG. 2A illustrates an example circuit, and FIG. 2B illustrates a graphical representation of the circuit of FIG. 2A. Circuit 200 includes registers 202 and 204, adder 206, and register 208.

In FIG. 2B, graph 220 is directed and partitioned consistent with the registers 202, 204, and 206. Adder 206 of FIG. 2A is represented as logic circle 222 in FIG. 2B. Generally, the nodes of such a graph represent logic or function units, edges represent signals, and partition lines, for example, 224, 226, and 228 divide the graph into time-relative stages. The intersection of a signal line with a partition line represents a register. For example, the intersection of edge 230 with partition line 224 corresponds to register 202, the intersection of the edge with partition line 226 corresponds to register 204, and the intersection of edge 232 with partition line 228 corresponds to register 208. The region bounded by partition lines is also referred to as a "timeslot," with an earlier timeslot positioned above a later timeslot. The collection of timeslots is sometimes referred to as a schedule.

In some synthesized designs certain nodes or sets of nodes can be moved from one timeslot to another without changing the behavior of the circuit relative to the input signals and output signals. The input/output signal lines are said to have "slack" relative to the node or set of nodes.

FIG. 3A is an graph of an example circuit in which two input signals lines 302, 304 have slack relative to an adder node 306. Each of the two input signals 302 and 304 is delayed by two registers/timeslots as illustrated by partition lines 308 and 310. The output signal 312 is provided as input to register layer (partition line) 314. FIG. 3B shows that if the adder node is moved one timeslot earlier, one layer of registers is removed relative to the input signals 302 and 304, and a register layer is added to the output signal. Register layer 310 becomes an output register layer. By moving the adder node to the earlier timeslot, the slack is removed on the input signal lines. Relative to the input and output signals, the behavior of the circuit of FIG. 3B is the same as the circuit of FIG. 3A.

As stated above, it is sometimes possible to reduce the number of pipeline stages, and hence registers, by reducing the slack between SCCs. Recall that an SCC of a graph is a subset, S, of nodes in the graph such that any node in S is reachable from any other node in S, and S is not a subset of any larger such set of nodes. Relative to the present invention, any node that is not a member of any other SCC is an SCC with that node as the only member.

Whether moving an SCC increases or decreases the number of storage elements or registers required in the design depends on the data widths leading into or out of an SCC and whether the SCC is moved earlier or later in the timeslot schedule. By considering whether the required number of storage elements increases or decreases in each case where slack can be removed in either backward or forward time-slot-relative directions, a greater reduction in the number of required storage elements is achieved.

FIG. 4A is a partitioned directed graph of an example circuit. SCC 402 is separated from SCC 404 by register layers 412 and 414, and SCC 404 is separated from SCC 406 by register layers 416 and 418. Register layers 414 have each have a data width of 4 bits, and register layers 416 and 418 each have data widths of 8 bits. With the organization of SCCs and register layers of FIG. 4A, a total of 24 bits of storage is required (4+4+8+8=24). With the present invention, the differences in data widths between backward and forward in the time schedule biases the direction in which the SCC is moved.

If SCC 404 is moved backward in the time schedule toward SCC 402, as shown in FIG. 4B, the 4-bit register layer 414 of FIG. 4A becomes an 8-bit register layer 414' in FIG. 4B. Moving SCC 404 back in the schedule increases the required storage from 24 bits to 28 bits (4+8+8+8 28). Thus, even though the slack is reduced between SCC 402 and SCC 404, an associated cost is increased storage requirements.

If SCC 404 is moved forward in the schedule toward SCC 406 (relative to FIG. 4A), as shown in FIG. 4C, the 8-bit register layer 416 of FIG. 4A becomes a 4-bit register layer 416'. This movement of SCC 404 decreases the required storage from 24 bits to 20 bits(4+4+4+8=20).

Figure 5:
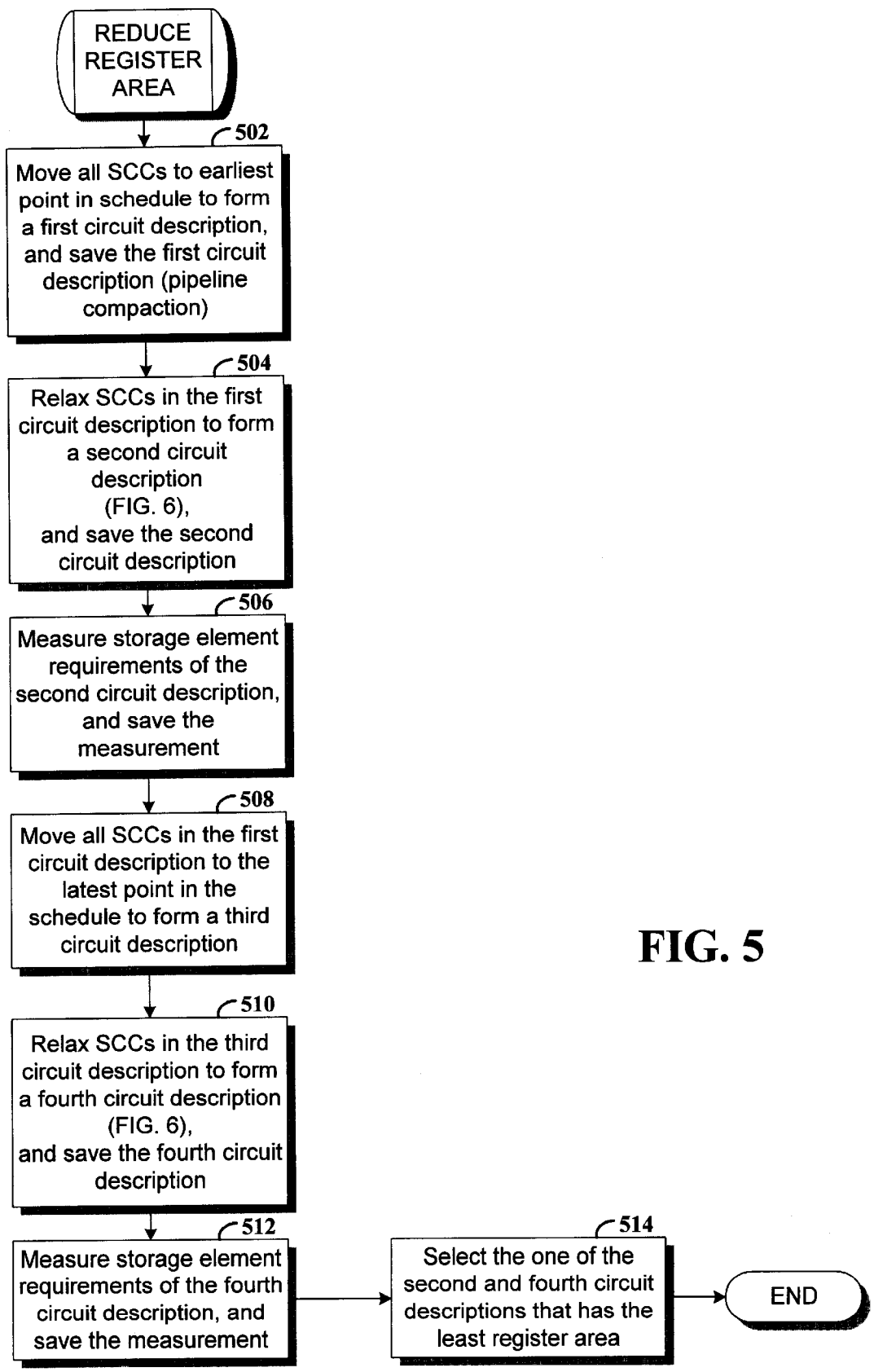
FIG. 5 is a flowchart of an example process for reducing the storage element requirements by movement of SCCs in accordance with one embodiment of the invention.

FIG. 5 is a flowchart of an example process for reducing the storage element requirements by movement of SCCs in accordance with one embodiment of the invention. The process begins by performing pipeline compaction to move the SCCs to the earliest feasible point in the schedule, and the result is saved as a first circuit description (step 502). The pipeline compaction can be performed using current or improved methods. The first circuit description is then further processed by reducing the slack between SCCs (step 504) in accordance with the process of FIG. 6. The result is a second circuit description which is also saved.

The storage element requirements of the second circuit description are then determined (step 506). In an example embodiment, the storage element requirements are determined by counting the numbers of bits required by the registers in the circuit description.

Using the first circuit description as a starting point, the SCCs are then moved to the latest point in the schedule using pipeline compaction in the forward direction, thereby forming a third circuit layout (step 508). The third circuit description is then further processed by reducing the slack between SCCs (step 510) to produce a fourth circuit description.

The storage element requirements of the fourth circuit description are then determined (step 512) in the same manner as for the second circuit description. The one of the second and fourth circuit descriptions that has the lesser storage requirements is selected as the final circuit description (step 514).

Figure 6:
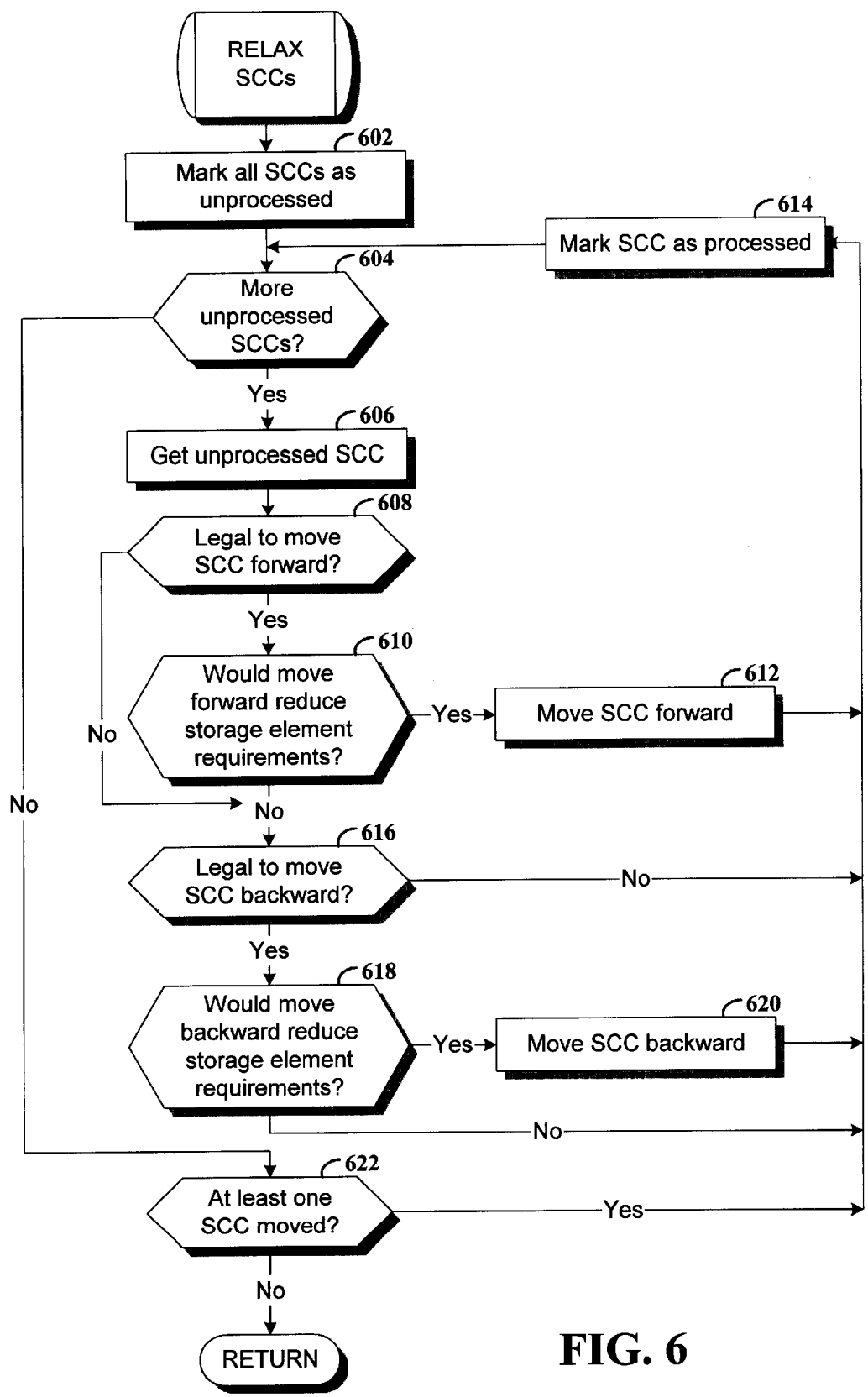
FIG. 6 is a flowchart of an example process for reducing slack between SCCs.

FIG. 6 is a flowchart of an example process for reducing the slack between SCCs. The SCCs in the circuit description are initially marked as "unprocessed", which connotes that the SCCs have not yet been processed (step 602). As long as there are unprocessed SCCs (decision step 604), the process obtains an unprocessed SCC (step 606) and proceeds to check whether it is legal to move the selected SCC forward in the schedule (decision step 608).

A forward move is legal if all the output edges from the SCC have slack. Another aspect of whether a move is legal relates to the initiation interval of the circuit definition, which affects the number of timeslots the SCC can be moved. If an SCC does not share any resources, for example, function units, logic, etc., with any other SCC, the SCC may be moved an integral number of timeslots. If the SCC does share resources with another SCC, the SCC may be moved n timeslots, where n is an integral multiple of the initiation interval.

Before moving the SCC forward, the process checks whether the forward move would reduce the requirements for storage elements (decision step 610) relative to the storage element requirements of the current circuit description. The storage element requirements are determined as previously described. If moving the SCC forward would reduce the storage element requirements, the SCC is moved forward (step 612), the SCC is designated as "processed", and the process returns to step 604.

If moving the SCC forward would not reduce the storage element requirements, the process proceeds to check whether moving the SCC backward is legal (step 616). A move backward is legal if all the input edges have slack, with the size of the move restricted by the initiation interval. If moving the SCC backward is legal, the process checks whether the move would reduce the storage element requirements relative to the current circuit definition (decision step 618). If moving the SCC backward reduces the storage element requirements, the SCC is moved backward (step 620) and designated as "processed" (step 614).

If the SCC is not moved, the SCC is designated as processed, and the process proceeds to check the other SCCs. Once all the SCCs have been processed (decision step 604), the process checks whether any of the SCCs were moved, either forward or backward (decision step 622). If so, the process is repeated, beginning with marking all the SCCs as unprocessed (step 602). Otherwise, the process is complete, and control is returned to the process of FIG. 5.

The present invention is believed to be applicable to a variety of optimization methods and has been found to be particularly applicable and beneficial in reducing storage element requirements in a pipelined synchronous circuit. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for reducing a number of storage elements in a synthesized synchronous circuit represented as a directed, partitioned graph, wherein the graph is divided into a plurality of time-ordered timeslots that are bounded by storage elements, comprising:

identifying strongly-connected components (SCCs) in the graph;

performing pipeline compaction of the SCCs toward an earliest one of the timeslots, whereby a first compacted graph is generated;

moving SCCs in the first compacted graph using respectively selected time-slot-relative directions, whereby a second graph is generated, wherein for each middle SCC where there is slack between the middle SCC and a first SCC and slack between the middle SCC and a second SCC, the selected time-slot-relative direction for moving the middle SCC is a function of a number of storage elements required for moving the middle SCC toward the first SCC versus moving the middle SCC toward the second SCC;

performing pipeline compaction of the SCCs in the first graph toward a latest one of the timeslots, whereby a third compacted graph is generated;

moving SCCs in the third compacted graph using respectively selected time-slot-relative directions, whereby a fourth graph is generated, wherein for each middle SCC where there is slack between the middle SCC and a first SCC and slack between the middle SCC and a second SCC, the selected time-slot-relative direction for moving the middle SCC is a function of a number of storage elements required for moving the middle SCC toward the first SCC versus moving the middle SCC toward the second SCC; and selecting one of the second and fourth graphs having a lesser total storage element count.

2. The method of claim 1, further comprising for each middle SCC:

counting a number of storage elements required in the graph prior to moving the middle SCC as a current count;

counting a number of storage elements required if the middle SCC is moved toward the second SCC as a forward-movement count;

moving the middle SCC toward the second SCC if the forward-movement count is less than the current count;

counting a number of storage elements required if the middle SCC is moved toward the first SCC as a backward-movement count; and moving the middle SCC toward the first SCC if the backward-movement count is less than the current count.

3. The method of claim 2, further comprising moving the middle SCC toward the first SCC if the forward-movement count is equal to the current count.

4. The method of claim 2, further comprising moving the middle SCC toward the second SCC if the backward-movement count is equal to the current count.

5. The method of claim 1, further comprising for each middle SCC:

counting a number of storage elements required if the middle SCC is moved toward the first SCC as a backward-movement count;

counting a number of storage elements required if the middle SCC is moved toward the second SCC as a forward-movement count;

moving the middle SCC toward the first SCC if the backward-movement count is less than the forward-movement count; and moving the middle SCC toward the second SCC if the forward-movement count is less than the backward-movement count.

6. The method of claim 5, further comprising moving the middle SCC toward the first SCC if the forward-movement count is equal to the backward-movement count.

7. The method of claim 5, further comprising moving the middle SCC toward the second SCC if the forward-movement count is equal to the backward-movement count.

8. The method of claim 1, further comprising moving the middle SCC an integral number of timeslots if the middle SCC does not share any resource with any other SCC.

9. The method of claim 8, wherein the circuit implements a program loop, and an initiation interval is a fixed number of timeslots in which an iteration of the loop is implemented, the method further comprising moving the middle SCC n timeslots, where n is an integral multiple of the initiation interval, if the SCC shares at least one resource with another SCC.

10. All apparatus for reducing a number of storage elements in a synthesized synchronous circuit represented as a directed, partitioned graph, wherein the graph is divided into a plurality of time-ordered timeslots that are bounded by storage elements, comprising:

means for identifying strongly-connected components (SCCs) in the graph;

means for performing pipeline compaction of the SCCs toward an earliest one of the timeslots, whereby a first compacted graph is generated;

means for moving SCCs in the first compacted graph using respectively selected time-slot-relative directions, whereby a second graph is generated, wherein for each middle SCC where there is slack between the middle SCC and a first SCC and slack between the middle SCC and a second SCC, the time-slot-relative direction for moving the middle SCC is a function of a number of storage elements required for moving the middle SCC toward the first SCC versus moving the middle SCC toward the second SCC;

means for performing pipeline compaction of the SCCs in the first graph toward a latest one of the timeslots, whereby a third compacted graph is generated;

means for moving SCCs in the third compacted graph using respectively selected time-slot-relative directions, whereby a fourth graph is generated, wherein for each middle SCC where there is slack between the middle SCC and a first SCC and slack between the middle SCC and a second SCC, the selected time-slot-relative direction for moving the middle SCC is a function of a number of storage elements required for moving the middle SCC toward the first SCC versus moving the middle SCC toward the second SCC; and means for selecting one of the second and fourth graphs having a lesser total storage element count.

11. An article of manufacture, comprising:

a computer-readable medium configured with program code for causing a computer to reduce a number of storage elements in a synthesized synchronous circuit represented as a directed, partitioned graph that is divided into a plurality of time-ordered timeslots that are bounded by storage elements, by performing the steps comprising, identifying strongly-connected components (SCCs) in the graph;

performing pipeline compaction of the SCCs toward an earliest one of the timeslots, whereby a first compacted graph is generated;

moving SCCs in the first compacted graph using respectively selected time-slot-relative directions, whereby a second graph is generated, wherein for each middle SCC where there is slack between the middle SCC and a first SCC and slack between the middle SCC and a second SCC, the selected time-slot-relative direction for moving the middle SCC is a function of a number of storage elements required for moving the middle SCC toward the first SCC versus moving the middle SCC toward the second SCC;

performing pipeline compaction of the SCCs in the first graph toward a latest one of the timeslots, whereby a third compacted graph is generated;

moving SCCs in the third compacted graph using respectively selected time-slot-relative directions, whereby a fourth graph is generated, wherein for each middle SCC where there is slack between the middle SCC and a first SCC and slack between the middle SCC and a second SCC, the selected time-slot-relative direction for moving the middle SCC is a function of a number of storage elements required for moving the middle SCC toward the first SCC versus moving the middle SCC toward the second SCC; and selecting one of the second and fourth graphs having a lesser total storage element count.

12. The article of manufacture of claim 11, wherein the computer-readable medium is further configured with program code for causing a computer, for each middle SCC, to perform the steps comprising:

counting a number of storage elements required in the graph prior to moving the middle SCC as a current count;

counting a number of storage elements required if the middle SCC is moved toward the second SCC as a forward-movement count;

moving the middle SCC toward the second SCC if the forward-movement count is less than the current count;

counting a number of storage elements required if the middle SCC is moved toward the first SCC as a backward-movement count; and moving the middle SCC toward the first SCC if the backward-movement count is less than the current count.

13. The article of manufacture of claim 11, wherein the computer-readable medium is further configured with program code for causing a computer, for each middle SCC, to perform the steps comprising:

counting a number of storage elements required if the middle SCC is moved toward the first SCC as a backward-movement count;

counting a number of storage elements required if the middle SCC is moved toward the second SCC as a forward-movement count;

moving the middle SCC toward the first SCC if the backward-movement count is less than the forward-movement count; and moving the middle SCC toward the second SCC if the forward-movement count is less than the backward-movement count.

* * * * *